(12) United States Patent
Oka et al.

(10) Patent No.: US 9,793,369 B2
(45) Date of Patent: Oct. 17, 2017

(54) MIS-TYPE SEMICONDUCTOR DEVICE

(71) Applicant: TOYODA GOSEI CO., LTD., Kiyosu-shi (JP)

(72) Inventors: Tohru Oka, Kiyosu (JP); Takahiro Sonoyama, Kiyosu (JP); Kiyotaka Mizukami, Kiyosu (JP)

(73) Assignee: TOYODA GOSEI CO., LTD., Kiyosu-Shi, Aichi-ken (JP)

( * ) Notice: Subject to any disclaimer, the term of this patent is extended or adjusted under 35 U.S.C. 154(b) by 0 days.

(21) Appl. No.: 14/838,121

(22) Filed: Aug. 27, 2015

(65) Prior Publication Data

US 2016/0064502 A1   Mar. 3, 2016

(30) Foreign Application Priority Data

Aug. 29, 2014   (JP) .................. 2014-175606

(51) Int. Cl.
*H01L 29/51* (2006.01)
*H01L 29/423* (2006.01)
(Continued)

(52) U.S. Cl.
CPC ...... *H01L 29/518* (2013.01); *H01L 29/66462* (2013.01); *H01L 29/7786* (2013.01);
(Continued)

(58) Field of Classification Search
CPC ........... H01L 29/42364; H01L 29/2003; H01L 29/511; H01L 29/518
USPC ....................................... 257/411
See application file for complete search history.

(56) References Cited

U.S. PATENT DOCUMENTS 6,849,908 B2   2/2005  Hirano et al.
7,301,185 B2   11/2007  Chen et al.
(Continued)

FOREIGN PATENT DOCUMENTS

JP   2004-259906 A   9/2004
JP   2005-044835 A   2/2005
(Continued)

OTHER PUBLICATIONS

Japanese Office Action dated Apr. 25, 2017, with a partial English translation.

*Primary Examiner* — Moazzam Hossain
*Assistant Examiner* — Omar Mojaddedi
(74) *Attorney, Agent, or Firm* — McGinn IP Law Group, PLLC

(57) ABSTRACT

The present invention provides a MIS-type semiconductor device having a $ZrO_xN_y$ gate insulating film in which threshold voltage shift is suppressed, thereby achieving stable operation. In the MIS-type semiconductor device having a gate insulating film on the semiconductor layer and a gate electrode on the gate insulating film, with a gate applied voltage of 5 V or more, the gate insulating film is formed of $ZrO_xN_y$ (x and y satisfy the relation: x>0, y>0, $0.8 \leq y/x \leq 10$, and $0.8 \leq 0.59x+y \leq 1.0$). The MIS-type semiconductor device having such a gate insulating film can perform stable operation because there is no shift in the threshold voltage even if a high voltage is applied to the gate electrode.

16 Claims, 7 Drawing Sheets

(51) Int. Cl.
  *H01L 29/78* (2006.01)
  *H01L 21/28* (2006.01)
  *H01L 27/092* (2006.01)
  *H01L 29/66* (2006.01)
  *H01L 29/778* (2006.01)
  *H01L 29/20* (2006.01)

(52) U.S. Cl.
  CPC .......... *H01L 29/78* (2013.01); *H01L 29/7813* (2013.01); *H01L 29/2003* (2013.01); *H01L 29/4236* (2013.01)

(56) References Cited

U.S. PATENT DOCUMENTS

| | | | |
|---|---|---|---|
| 7,999,332 B2 | 8/2011 | Yuan et al. | |
| 8,022,488 B2 | 9/2011 | Cheng et al. | |
| 2003/0205772 A1 | 11/2003 | Schaeffer, III et al. | |
| 2008/0169520 A1* | 7/2008 | Kiyomura | H01L 21/3141 257/411 |
| 2013/0183805 A1* | 7/2013 | Wong | H01L 27/10861 438/387 |
| 2013/0193522 A1* | 8/2013 | Kwon | H01L 21/28088 257/369 |
| 2013/0280902 A1* | 10/2013 | Jagannathan | H01L 21/28211 438/595 |
| 2015/0001598 A1* | 1/2015 | Jagannathan | H01L 29/66545 257/288 |
| 2015/0279880 A1* | 10/2015 | Jangjian | H01L 27/1464 257/447 |
| 2015/0364566 A1* | 12/2015 | Liu | H01L 29/517 257/410 |
| 2016/0005831 A1* | 1/2016 | Ando | H01L 29/4966 257/401 |
| 2016/0027929 A1* | 1/2016 | Cheng | H01L 29/78696 257/9 |

FOREIGN PATENT DOCUMENTS

| | | |
|---|---|---|
| JP | 2005-217159 A | 8/2005 |
| JP | 2006-156990 A | 6/2006 |
| JP | 2010-267964 A | 11/2010 |
| JP | 2011-003899 A | 1/2011 |
| JP | 2013-506291 A | 2/2013 |
| JP | 2013-135055 A | 7/2013 |
| WO | WO 2011/037743 A2 | 3/2011 |

* cited by examiner

MIS-TYPE SEMICONDUCTOR DEVICE

BACKGROUND OF THE INVENTION

Field of the Invention

The present invention relates to a MIS-type semiconductor device having a gate insulating film formed of $ZrO_xN_y$ (zirconium oxynitride) on a semiconductor layer and a gate electrode on the gate insulating film, with a gate applied voltage of 5 V or more.

Background Art

With further miniaturization of semiconductor devices in recent years, thinner gate insulating film of transistor is in demand. However, there is a problem that when the conventionally used $SiO_2$ film is thinned, the leak current increases. Therefore, a high-k (high dielectric constant) material is used instead of $SiO_2$. A high-k material includes $HfO_2$, $ZrO_2$, $TiO_2$, $HfO_xN_y$, $ZrO_xN_y$, and others. Specifically, a MIS (Metal-Insulator-Semiconductor) type semiconductor device having a gate insulating film formed of $ZrO_xN_y$ is disclosed in Patent Documents 1 to 5.

Patent Document 1 discloses a semiconductor device having a gate insulating film on a semiconductor substrate and a gate electrode on the gate insulating film, wherein the gate insulating film is formed of $Zr_2ON_2$ or $ZrO_{2-2x}N_{4x/3}$ (where $3/8<x<3/4$). The gate insulating film is single crystal or polycrystal. The $Zr_2ON_2$ gate insulating film is formed by sputtering a $Zr_2ON_2$ ceramic target. Argon is used as a sputtering gas, a substrate temperature is from 600° C. to 800° C., and a sputtering gas pressure is from 0.5 Pa to 0.2 Pa.

Patent Document 2 discloses a MIS-type semiconductor device having a gate insulating film formed of $ZrO_2$ containing nitrogen, wherein the nitrogen concentration of the gate insulating film is higher on the channel side than on the gate electrode side, and the nitrogen concentration of the gate insulating film on the channel side is $10^{20}/cm^3$ to $10^{21}/cm^3$. The gate insulating film is formed by sputtering in a mixture gas of nitrogen and oxygen diluted with argon gas at a temperature from room temperature to 800° C. and a pressure from 0.1 mPa to 1 kPa. There is no specific description of which state the gate insulating film is in: single crystal, polycrystal or amorphous.

Patent Document 3 discloses a MIS-type semiconductor device in which a chemical oxide layer, a high-k dielectric layer, a lower metal layer, a capturing metal layer, an upper metal layer, and a polycrystalline semiconductor layer are sequentially deposited on a semiconductor substrate. Si or Group III-V semiconductor may be employed as a semiconductor substrate. The high-k dielectric layer may be formed of $ZrO_xN_y$ ($0.5 \le x \le 3$, $0 \le y \le 2$). There is no specific description of which state the high-k dielectric material is in: single crystal, polycrystal, or amorphous. The high-k dielectric layer may be formed through CVD or ALD. However, there is no specific description about the formation of the high-k dielectric layer by sputtering.

Patent Document 4 discloses that in MISFET, a gate insulating film is formed of $ZrO_xN_y$ by sputtering a Zr target in an atmosphere of mixture gas of oxygen and nitrogen introduced into argon.

Patent Document 1: Japanese Patent Application Laid-Open (kokai) No. 2005-44835
Patent Document 2: Japanese Patent Application Laid-Open (kokai) No. 2005-217159
Patent Document 3: Japanese Patent Application Laid-Open (kokai) No. 2011-3899
Patent Document 4: U.S. Patent Application Publication No. 2003/0205772 A1
Patent Document 5: Japanese Patent Application Laid-Open (kokai) No. 2013-135055

The inventors have studied the miniaturization of the MIS type power device by employing a high-k dielectric gate insulating film formed of $ZrO_xN_y$. However, it was found that when the gate insulating film is formed of $ZrO_xN_y$, the threshold gate voltage shifts due to high applied voltage, resulting in an unstable operation, at certain composition ratios x and y of $ZrO_xN_y$. Therefore, the inventors of the present application developed a technique disclosed in Patent Document 5 in order to solve the above problem. Moreover, they found an optimized range of the oxygen composition ratio x and the nitrogen composition ratio y in the gate insulating film formed of $ZrO_xN_y$, with less shift in threshold voltage than the relationship between the oxygen composition ratio x and the nitrogen composition ratio y disclosed in Patent Document 5.

SUMMARY OF THE INVENTION

In view of the foregoing, an object of the present invention is to provide a MIS-type semiconductor device having a gate insulating film of $ZrO_xN_y$ on a semiconductor layer and a gate electrode on the gate insulating film, wherein shift in threshold voltage is further suppressed, thereby improving the operation stability.

In a first aspect of the present invention, there is provided a MIS-type semiconductor device having a gate insulating film formed of $ZrO_xN_y$ on a semiconductor layer and a gate electrode on the gate insulating film, with a gate applied voltage of 5 V or more, wherein the oxygen composition ratio x and the nitrogen composition ratio y of the gate insulating film satisfy the relation: $x>0$, $y>0$, $0.8 \le y/x \le 10$, and $0.8 \le 0.59x+y \le 1.0$. The oxygen composition ratio x and the nitrogen composition ratio y, more preferably, satisfy the relation: $0.87 \le 0.59x+y \le 0.93$.

The semiconductor layer may be, for example, a Si layer, a Group III nitride semiconductor layer, a Group III-V semiconductor layer, a Group II-VI compound semiconductor layer, or a SiC layer. The Group III nitride semiconductor layer includes a GaN layer, an AlGaN layer, an InGaN layer, an AlN layer, or an AlGaInN layer. The Group III-V semiconductor layer includes a GaAs layer, a GaP layer, or a GaInP layer. The Group II-VI compound semiconductor layer includes a ZnO layer. The semiconductor layer may be doped with an n-type impurity or a p-type impurity. Moreover, the semiconductor layer may be a semiconductor substrate itself or a semiconductor layer formed on a semiconductor substrate or an insulating substrate. The semiconductor layer may comprise a plurality of layers having different materials, composition ratios, conduction types, and impurity concentrations.

The gate insulating film may comprise a plurality of layers having different composition ratios as long as the composition ratios x and y of $ZrO_xN_y$ satisfy the range as indicated above. The semiconductor layer and the gate insulating film may be directly in contact with each other, or other insulating film may be formed between the semiconductor layer and the gate insulating film. In this case, the insulating film may be formed of $SiO_2$, $Si_xN_y$, $ZrO_2$ or similar materials. The gate insulating film and the gate electrode may be directly in contact with each other, or other insulating film or metal film may be formed between the gate insulating film and the gate electrode.

When the oxygen composition ratio x and the nitrogen composition ratio y of the gate insulating film are limited to satisfy the relation: $1 \le y/x \le 4$, shift in threshold voltage can be further suppressed. When $y/x \le 4$, gate leakage current can be effectively suppressed due to higher oxygen composition ratio. In addition, when the oxygen composition ratio x is within a range of $0.2 \le x < 0.5$, shift in threshold voltage can be further suppressed. When the oxygen composition ratio x is 0.2 or more, the gate leakage current can be effectively suppressed. In this range, the threshold voltage shift amount $\Delta V$ can be suppressed to 0.2 V or less. More preferably, the oxygen composition ratio x is within a range of $0.3 \le x < 0.5$. In this range as well, the threshold voltage shift amount $\Delta V$ can be suppressed to 0.2 V or less. When the oxygen composition ratio x is within a range of $0.21 \le x \le 0.41$, the threshold voltage shift amount $\Delta V$ can be suppressed to 0.05 V or less.

A $ZrO_U N_V$ surface layer is formed on the gate insulating film, and the oxygen composition ratio u of the surface layer is preferably higher than the oxygen composition ratio x of the gate insulating film. Needless to say, the surface layer also serves as a gate insulating film, thereby further suppressing the gate leakage current. Preferably, the thickness of the surface layer having a higher oxygen composition ratio is 1 nm or more, and smaller than that of the gate insulating film. More preferably, the thickness of the surface layer is 2 nm or more, and smaller than that of the gate insulating film. Preferably, the oxygen composition ratio u of the surface layer is 2 or less, and higher than the oxygen composition ratio x. The nitrogen composition ratio v of the surface layer preferably satisfies a range of $0 \le v \le 0.5$. The oxygen composition ratio u and the nitrogen composition ratio v of the surface layer may satisfy the relation: $0.8 \le v/u \le 10$, and $0.8 \le 0.59u + v \le 1.0$. That is, when the oxygen composition ratio u is as high as possible within this range, shift in threshold value and generation of gate leakage current can be effectively suppressed. The surface layer is preferably continuous with the gate insulating film. The oxygen composition ratio u of the surface layer may be increased as it is closer to the gate electrode side in a thickness direction. The surface layer is preferably formed by annealing in a nitrogen atmosphere with the surface of the gate insulating film exposed after the film formation. Such a structure can suppress the gate leakage current. The gate insulating film is preferably microcrystal. Between the gate insulating film and the semiconductor layer, other insulating film which serves as a gate insulating film having a different composition may be formed. When the semiconductor layer is a Group III nitride semiconductor layer, a gate applied voltage and a drain-source voltage can be increased, which is suitable for a power device.

The MIS-type semiconductor device of the present invention is effective particularly when the gate applied voltage is 10 V or more. Even at such a high gate applied voltage, the MIS-type semiconductor device of the present invention can suppress shift in threshold voltage. The MIS-type semiconductor device can be suitably employed in a power semiconductor device, and can be applied to a semiconductor device such as MISFET, MISHFET, and IGBT.

In the MIS-type semiconductor device according to the present invention, even when the gate applied voltage is high, shift in threshold voltage can be suppressed, thereby improving the operation stability. The reason is not sufficiently clear why such an effect of stabilizing the threshold value is obtained by the gate insulating film of the present invention. However, it is assumed because the local energy levels produced due to lack of oxygen in the gate insulating film are reduced by nitrogen in the gate insulating film. The present invention is effective for the MIS-type semiconductor device with a gate applied voltage of 5 V or more, particularly 10 V or more, and can be employed in a power semiconductor device. The gate insulating film according to the present invention is stable for heat treatment according to the present invention.

BRIEF DESCRIPTION OF THE DRAWINGS

Various other objects, features, and many of the attendant advantages of the present invention will be readily appreciated as the same becomes better understood with reference to the following detailed description of the preferred embodiments when considered in connection with the accompanying drawings, in which.

DETAILED DESCRIPTION OF PREFERRED EMBODIMENTS

Specific embodiments of the present invention will next be described with reference to the drawings. However, the present invention is not limited to the embodiments.

Embodiment 1

Figure 1:
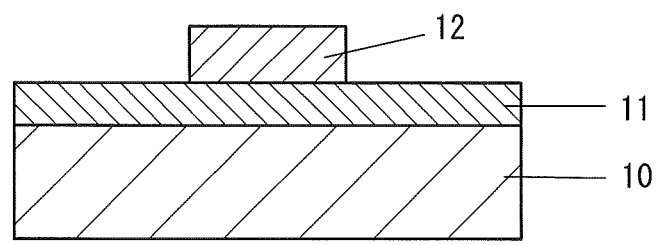
FIG. 1 is a cross-sectional view showing the structure of a MIS-type semiconductor device according to Embodiment 1.

FIG. 1 is a cross-sectional view showing the structure of a gate electrode of a MIS-type semiconductor device according to Embodiment 1. The MIS-type semiconductor device according to Embodiment 1 comprises a semiconductor layer 10, a gate insulating film 11 disposed on and in contact with the semiconductor layer 10, a gate electrode 12 on and in contact with a part of the gate insulating film 11. In the present embodiment, the C-V characteristics in the $ZrO_x N_y$ gate insulating film and the relationship between the threshold voltage shift amount $\Delta V$ and the ratio of oxygen composition ratio x to nitrogen composition ratio y are measured. Therefore, source electrode and drain electrode are omitted. The detailed structure of the MIS-type semiconductor device is described in Embodiments 2 and 3.

The semiconductor layer 10 is an n-type Si substrate having a thickness of 600 μm. The semiconductor layer may be a Group III nitride semiconductor layer, a Group III-V semiconductor layer, a Group II-VI compound semiconductor layer, or a SiC layer, in place of Si. The Group III nitride semiconductor layer is formed of, for example, GaN, AlN, AlGaN, InGaN, or AlGaInN. The Group III-V semiconductor layer is a layer formed of, for example, GaAs, GaP, or GaInP. The Group II-VI compound semiconductor layer is formed of, for example, ZnO. Moreover, the conduction type of the semiconductor layer 10 is not limited to n-type, and may be p-type or i-type (intrinsic). The semiconductor layer 10 is not limited to a single layer, and may comprise a plurality of layers. For example, it may have a structure in which a plurality of layers having different materials, conduction types, composition ratios, or impurity concentrations are deposited. The semiconductor layer 10 may be a semiconductor substrate itself or a layer formed on a semiconductor substrate or an insulating substrate.

The gate insulating film 11 is formed of $ZrO_xN_y$ (x and y satisfy the relation: $x>0$, $y>0$, $0.8 \leq y/x \leq 10$, and $0.8 \leq 0.59x+y \leq 1.0$) having a thickness of 75 nm. The oxygen composition ratio x and the nitrogen composition ratio y, more preferably, satisfy the relation: $0.87 \leq 0.59x+y \leq 0.93$.

The gate insulating film 11 may be disposed on and in contact with the semiconductor layer 10 as in Embodiment 1. However, it may be disposed on the semiconductor layer 10 via other insulating film. For example, an insulating film of $SiO_2$ or $Si_xN_y$, $ZrO_2$ may be formed between the semiconductor layer 10 and the gate insulating film 11.

The gate electrode 12 may be formed of Al, polysilicon, W, and others. The gate electrode 12 may be disposed on and in contact with the gate insulating film 11 as in Embodiment 1. It may also be disposed via other layer on the gate insulating film 11. For example, other insulating film or a metal film may be formed between the gate insulating film 11 and the gate electrode 12.

In the MIS-type semiconductor device according to Embodiment 1, the gate insulating film 11 is formed of $ZrO_xN_y$ (x and y satisfy the relation: $x>0$, $y>0$, $0.8 \leq y/x \leq 10$, and $0.8 \leq 0.59x+y \leq 1.0$). Therefore, even if a high voltage of 5 V or more is applied, shift in threshold voltage is suppressed and stable operation can be achieved. The MIS-type semiconductor device according to Embodiment 1 can perform stable operation even if the gate applied voltage is 5 V or more, particularly 10 V or more. The MIS-type semiconductor device according to Embodiment 1 is suitable for use as a power semiconductor device such as FET, HFET, and IGBT because stable operation can be achieved at such a high gate applied voltage.

The ratio y/x of nitrogen composition ratio y to oxygen composition ratio x of the gate insulating film 11 more preferably satisfies the relation: $1 \leq y/x \leq 4$. Shift in threshold voltage is further suppressed, thereby achieving stable operation.

Moreover, the oxygen composition ratio x may satisfy a range of $0.2 \leq x < 0.5$, and further, $0.3 \leq x < 0.5$. In the MIS-type semiconductor device according to Embodiment 1 having the gate insulating film 11 in such a composition range of x and y as well, shift in threshold voltage is suppressed, and stable operation can be achieved.

Next will be described a process for producing the MIS-type semiconductor device according to Embodiment 1.

Figure 2A:
FIGS. 2A and 2B are sketches showing processes for producing the MIS-type semiconductor device according to Embodiment 1.

Firstly, a semiconductor layer 10 being an n-type Si substrate was prepared. The surface of the semiconductor layer 10 was cleaned using acetone, IPA (isopropyl alcohol), and ultrapure water in this order to thereby remove oil from the surface of the semiconductor layer 10. Then, the semiconductor layer 10 was immersed in a buffered hydrogen fluoride (BHF) solution, thereby to remove an oxide film naturally formed on the surface of the semiconductor layer 10 (FIG. 2A).

Figure 2B:
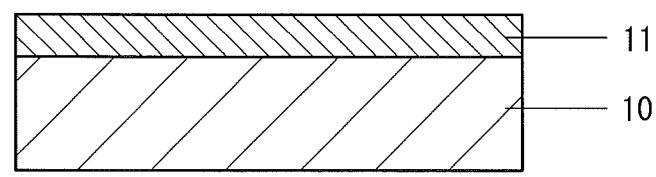

Subsequently, a $ZrO_xN_y$ gate insulating film 11 was formed on the cleaned semiconductor layer 10 by ECR (Electron Cyclotron Resonance) sputtering (FIG. 2B). Sputtering was performed using a Zr metal target in a mixture gas of nitrogen and oxygen mixed with argon gas. The substrate temperature was a room temperature. The pressure was an appropriate value within a range of 0.07 Pa to 0.2 Pa. The RF power was 500 W, and the microwave power was 500 W. To obtain desired oxygen composition ratio x and nitrogen composition ratio y of $ZrO_xN_y$ being formed, the gas flow rates were appropriately changed: argon gas within a range of 15 sccm to 30 sccm, oxygen gas within a range of 0.1 sccm to 3.0 sccm, and nitrogen gas within a range of within a range of 4.3 sccm to 17 sccm. The oxygen composition ratio x and the nitrogen composition ratio y of the gate insulating film 11 can be adjusted by the oxygen gas flow rate and the nitrogen gas flow rate.

In the above ECR sputtering, argon was employed as a carrier gas. However, other inert gas such as xenon may be employed. Other sputtering such as magnetron sputtering may be used instead of ECR sputtering. ECR sputtering has an advantage that the gate insulating film 11 can be formed at a lower temperature and a higher pressure than in other sputtering. The flow rates of argon gas, oxygen gas, and nitrogen gas are not limited to the above ranges. However, when they are within the above ranges, the oxygen composition ratio x and the nitrogen composition ratio y of $ZrO_xN_y$ can be accurately adjusted.

Before forming the gate electrode 12 after the formation of the gate insulating film 11, heat treatment was performed at 400° C. for 30 minutes in a nitrogen atmosphere. Heat treatment may be performed at a temperature within a range of 300° C. to 700° C., preferably, 400° C. to 700° C. for 5 minutes to 90 minutes, preferably, 30 minutes to 90 minutes, and more preferably, 30 minutes to 60 minutes. These conditions are appropriately selected according to the oxygen composition ratio and the thickness of target surface layer. Thus, the surface layer is formed so as to have an oxygen composition ratio higher than the oxygen composition ratio at the center of the thickness. As used herein, "nitrogen atmosphere" encompasses a gas atmosphere containing not less than 99% nitrogen. A mixture gas of Ar, $H_2$ and $N_2$, and vacuum as well as nitrogen atmosphere may be employed as an atmosphere for heat treatment.

By appropriately setting the above conditions, the gate insulating film 11 can be formed so as to have the oxygen composition ratio x and the nitrogen composition ratio y satisfying the relation: $x>0$, $y>0$, $0.8 \leq y/x \leq 10$, and $0.8 \leq 0.59x+y \leq 1.0$.

Since the gate insulating film 11 is formed of microcrystal, the semiconductor layer 10 does not need to be lattice-matched. Therefore, the gate insulating film 11 can be formed on a $SiO_2$ insulating film or a compound semiconductor layer such as Group III-V compound semiconductor, Group II-VI compound semiconductor, and Group III nitride semiconductor instead of the Si semiconductor layer 10.

As understood from the evaluation described later, when the ratio of oxygen gas flow rate to nitrogen gas flow rate is 0.0118 to 0.1765 in ECR sputtering under the above conditions, the gate insulating film 11 can be formed so as to suppress shift in threshold voltage below 0.5 V. Particularly when the ratio of oxygen gas flow rate to nitrogen gas flow rate is 0.0588 to 0.1412, shift in threshold voltage can be suppressed below 0.2 V. Further, when the ratio of oxygen gas flow rate to nitrogen gas flow rate is 0.0588 to 0.1176, shift in threshold voltage can be suppressed below 0.05 V.

Next, a gate electrode 12 was formed on a predetermined region of the gate insulating film 11 by a lift-off technique. More specifically, a resist film was formed on a region other than the predetermined region of the gate insulating film 11 through photolithography, and an electrode film was formed on the predetermined region and the resist film through vapor deposition. Subsequently the resist film and a part of the electrode film thereon were removed by a lift-off technique so that the electrode film remains only on the predetermined region, thereby forming the gate electrode 12 only on the predetermined region of the gate insulating film 11. Thus, the MIS-type semiconductor device according to Embodiment 1 shown in FIG. 1 was produced.

By the above described method for producing the MIS-type semiconductor device according to Embodiment 1, the gate insulating film 11 can be formed of $ZrO_xN_y$ having the oxygen composition ratio x and the nitrogen composition ratio y satisfying the relation: $x>0$, $y>0$, $0.8 \leq y/x \leq 10$, and $0.8 \leq 0.59x+y \leq 1.0$. Therefore, even when the gate applied voltage is 5 V or more, particularly, 10 V or more, shift in threshold voltage can be suppressed, thereby achieving stable operation. Since the gate insulating film 11 formed by the above method is thermally stable, the threshold voltage of the MIS-type semiconductor device according to Embodiment 1 hardly shifts due to temperature change, and is stable.

Specific evaluation of the MIS-type semiconductor device according to Embodiment 1 will next be given as Experimental Example.

The MIS-type semiconductor device according to Embodiment 1 having the gate insulating film 11 was produced by varying the oxygen composition ratio x and the nitrogen composition ratio y of $ZrO_xN_y$, and the C-V characteristics were measured to verify the stability of the threshold voltage. The C-V characteristics were varied by continuously and repeatedly sweeping the gate applied voltage from −2 V to 5 V, from 5V to −2 V, from −2 V to 10 V, from 10 V to −2 V, from −2 V to 15 V, from 15 V to −2 V, and from −2 V to 5V. The voltage sweeping rate was 0.1 V/s. At this time, the threshold voltage shift amount Δ V was measured.

Figure 11:
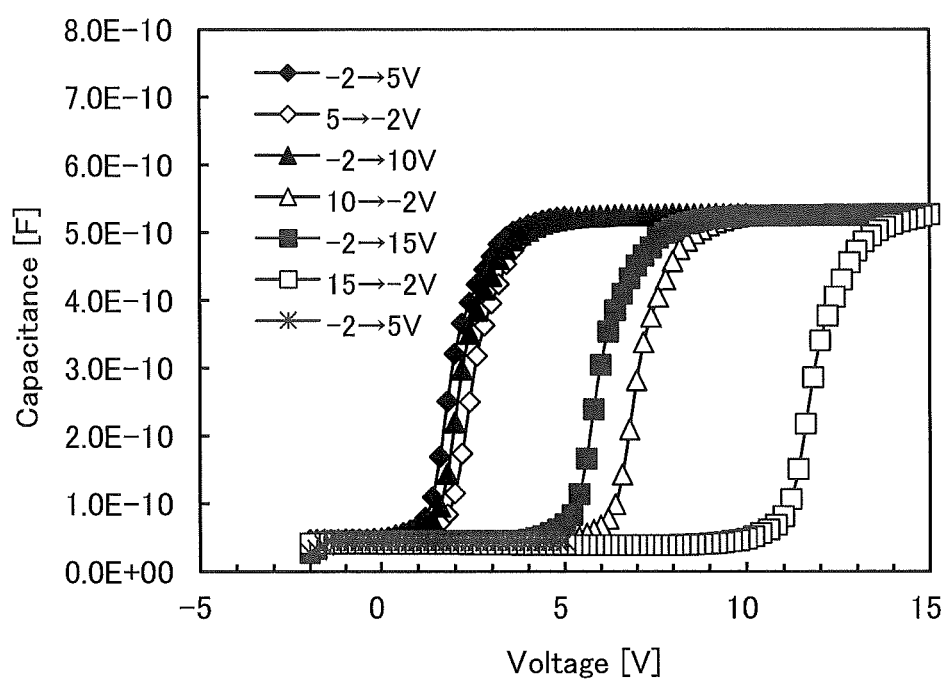
FIG. 11 is a graph showing the C-V characteristics exhibiting the threshold voltage shifts of the device in which the gate insulating film is formed of $ZrO_2$ in the conventional example.

As Comparative Example, a MIS-type semiconductor device having the same structure as that of the MIS-type semiconductor device according to Embodiment 1 was produced except for that the gate insulating film 11 is formed of $ZrO_2$, was produced to verify the stability of the threshold value. FIG. 11 is a graph showing the C-V characteristics of the MIS-type semiconductor device of the comparative example. As shown in FIG. 11, in sweeping the gate applied voltage, the threshold voltage in sweeping in an increasing direction from −2 V to 15 V is higher by about 4 V than the threshold voltage in sweeping in an increasing direction from −2 V to 10 V. The threshold voltage in sweeping in an increasing direction from −2 V to 10 V is higher by about 0.4 V than the threshold voltage in sweeping in an increasing direction from −2 V to 5 V. When comparing the threshold voltages in sweeping the gate applied voltage in a decreasing direction, the threshold voltage in sweeping from 10 V to −2 V is higher by about 4.6 V than the threshold voltage in sweeping from 5V to −2 V, and the threshold voltage in sweeping from 15 V to −2 V is higher by about 9.4 V than the threshold voltage in sweeping from 5V to −2 V. Thus, it is found that when the gate applied voltage exceeds 5 V, the threshold voltage largely varies as the gate voltage is increased.

Eight samples were produced by changing the oxygen gas flow rate to 0.1, 0.3, 0.5, 0.8, 1.0, 1.2, 1.5, and 2.0 sccm with the argon gas flow rate fixed to 20 sccm and the nitrogen gas flow rate fixed to 8.5 sccm in forming the gate insulating film 11 of the MIS-type semiconductor device according to Embodiment 1. The oxygen composition ratio x and the nitrogen composition ratio y of thus-formed $ZrO_xN_y$ were obtained by a combination of RBS (Rutherford Backscattering analysis) and XPS (X-ray Photoelectron Spectroscopy analysis). As the procedure, the standard sample was measured by RBS, and sensitivity coefficients for quantitative analysis of Zr, O and N in XPS were calculated using average composition ratios in a region (except for the surface layer) where the composition ratios of the gate insulating film 11 are stable.

Figure 3:
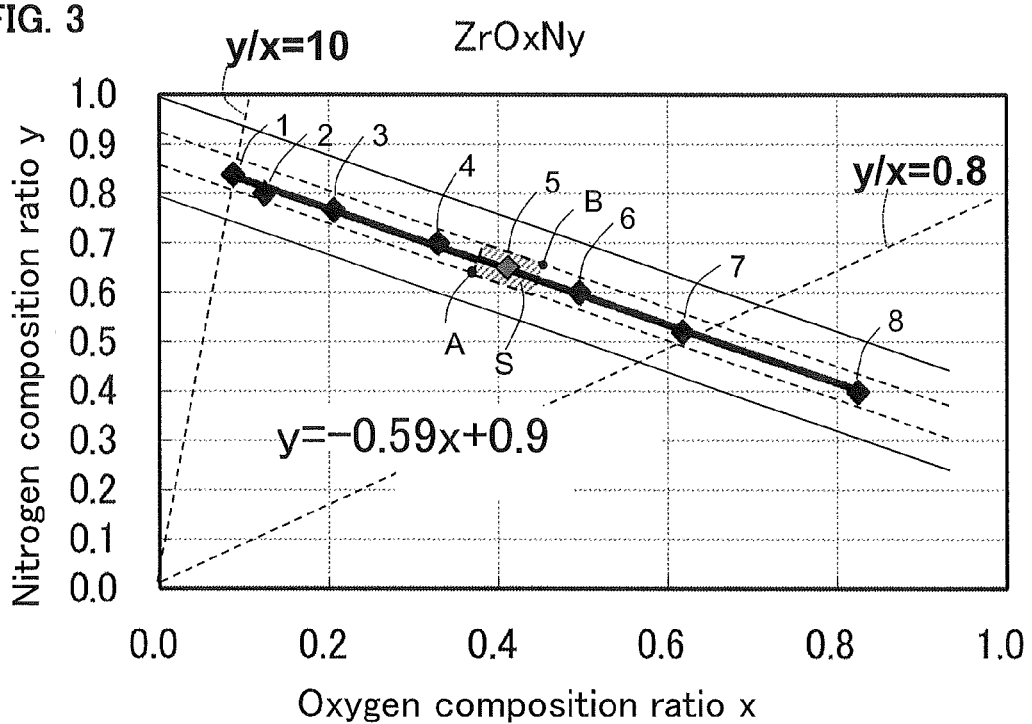
FIG. 3 is a graph showing the relationship between the oxygen composition ratio and the nitrogen composition ratio of the gate insulating film.

The gate insulating film 11 was formed in a microcrystal state in all eight samples. The oxygen composition ratio x and the nitrogen composition ratio y of the gate insulating film 11 were as shown in the graph of FIG. 3. That is, when the oxygen flow rate was 0.1 sccm (the ratio of oxygen gas flow rate/nitrogen gas flow rate was 0.0118), x was about 0.09, y was about 0.84, and the ratio of nitrogen to oxygen y/x was 9.3 (plot 1 of FIG. 3). When the oxygen gas flow rate was 0.3 sccm (the ratio of oxygen gas flow rate/nitrogen gas flow rate was 0.0353), x was about 0.12, y was about 0.80, and the ratio of nitrogen to oxygen y/x was 6.7 (plot 2 of FIG. 3). When the oxygen gas flow rate was 0.5 sccm (the ratio of oxygen gas flow rate/nitrogen gas flow rate was 0.0588), x was about 0.21, y was about 0.77, and the ratio of nitrogen to oxygen y/x was 3.7 (plot of FIG. 3). When the oxygen gas flow rate was 0.8 sccm (the ratio of oxygen gas flow rate/nitrogen gas flow rate was 0.0941), x was about 0.33, y was about 0.70, and the ratio of nitrogen to oxygen y/x was 2.1 (plot 4 of FIG. 3). When the oxygen gas flow rate was 1.0 sccm (the ratio of oxygen gas flow rate/nitrogen gas flow rate was 0.1176), x was about 0.41, y was about 0.65, and the ratio of nitrogen to oxygen y/x was 1.6 (plot 5 of FIG. 3). When the oxygen gas flow rate was 1.2 sccm (the ratio of oxygen gas flow rate/nitrogen gas flow rate was 0.1412), x was about 0.49, y was about 0.60, and the ratio of nitrogen to oxygen y/x was 1.2 (plot 6 of FIG. 3). When the oxygen gas flow rate was 1.5 sccm (the ratio of oxygen gas flow rate/nitrogen gas flow rate was 0.1765), x was about 0.62, y was about 0.52, and the ratio of nitrogen to oxygen y/x was 0.84 (plot 7 of FIG. 3). When the oxygen gas flow rate was 2.0 sccm (the ratio of oxygen gas flow rate/nitrogen gas flow rate was 0.2353), x was about 0.83, y was about 0.40, and the ratio of nitrogen to oxygen y/x was 0.48 (plot 8 of FIG. 3).

As is clear from FIG. 3, in all eight samples, the oxygen composition ratio x and the nitrogen composition ratio y of the gate insulating film 11 are included in a range where y has a width of ±0.1 with a straight line of $0.59x+y=0.9$ as a center, that is, a range satisfying the relation: $0.8 \leq 0.59x+y \leq 1.0$. A thick solid line ($0.59x+y=0.9$) of FIG. 3 was obtained by a least square approximation of the measured values (plot points 1 to 8). Moreover, x and y of eight samples also exist in a range of $0.87 \leq 0.59x+y \leq 0.93$. A plurality of samples about plot point 5 was formed under the same conditions. The oxygen composition ratio x of the gate insulating film had a variation of 0.38 to 0.44, and the nitrogen composition ratio y of the gate insulating film had a variation of 0.64 to 0.66. Then, the nitrogen composition ratio was determined as an average of 0.65. A straight line of $0.59x+y=0.87$ (lower dotted line) passing a first point A (nitrogen composition ratio y of 0.65, oxygen composition ratio x of 0.38) and having a gradient of −0.59 parallel to the straight line of $0.59x+y=0.9$ (thick solid line) was determined. Moreover, a straight line of $0.59x+y=0.93$ (upper dotted line) passing a second point B (nitrogen composition ratio y of 0.65, oxygen composition ratio x of 0.44) and having a gradient of −0.59 parallel to the straight line of $0.59x+y=0.9$ (thick solid line). The range of $0.87 \le 0.59x+y \le 0.93$ was determined in this way.

Figure 4:
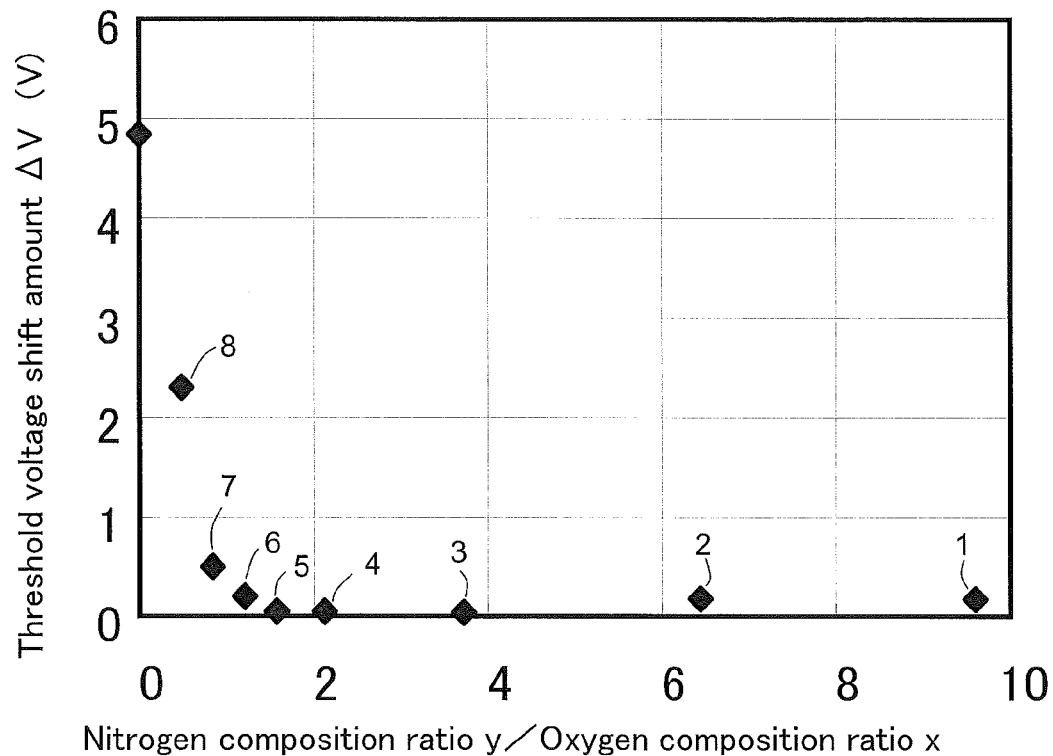
FIG. 4 is a graph showing the relationship between the threshold voltage shift amount and the ratio of nitrogen atom concentration/oxygen atom concentration of the gate insulating film.

FIG. 4 is a graph showing the threshold voltage shift amount $\Delta V$ of eight samples used in FIG. 3. When the applied voltage was swept in an increasing direction from −2 V to 10 V, in a decreasing direction from 10 V to −2 V, and in an increasing direction from −2 V to 15 V, the value obtained by subtracting the threshold voltage when the applied voltage was swept in an increasing direction from −2 V to 10V from the threshold voltage when the applied voltage was swept in an increasing direction from −2 V to 15 V is the threshold voltage shift amount $\Delta V$. The horizontal axis represents the composition ratio of nitrogen to oxygen y/x, that is, nitrogen composition ratio y/oxygen composition ratio x of $ZrO_xN_y$, which is the material of the gate insulating film 11, and the vertical axis represents the threshold voltage shift amount $\Delta V$.

As Comparative Example, the threshold voltage shift amount $\Delta V$ was measured by sweeping the applied voltage in the same way when y/x=0, that is, the gate insulating film 11 is formed of $ZrO_2$. The numbers assigned to the plot points in FIG. 4 correspond to the plot numbers in FIG. 3. The threshold voltage shift amount $\Delta V$ was about 4.8 V in the Comparative Example where the gate insulating film 11 is formed of $ZrO_2$, and the threshold voltage shift amount $\Delta V$ was about 2.3 V in the sample (plot point 8) in which the oxygen gas flow amount is 2.0 sccm. On the contrary, in other seven samples (plot points 1-7), the threshold voltage shift amount $\Delta V$ was 0.5 V or less. In this range, the ratio of oxygen gas flow rate/nitrogen gas flow rate is 0.0118 or more (plot point 1) and 0.1765 or less (plot point 7), and the ratio of nitrogen to oxygen y/x is 0.84 or more and 9.3 or less. Thus, it was found that when $0.8 \le 0.59x+y \le 1.0$ was satisfied and the composition ratio of nitrogen to oxygen y/x was $0.8 \le y/x \le 10$ in $ZrO_xN_y$, the threshold voltage shift amount $\Delta V$ was 0.5 V or less. When the shift amount $\Delta V$ is 0.5 V or less, the MIS-type semiconductor device according to Embodiment 1 in which the gate applied voltage is 5 V or more, particularly, 10 V or more can perform stable operation. The reason why the ratio of y/x was adjusted to 10 or less is that the properties become closer to those of a conductive ZrN as the nitrogen ratio of $ZrO_xN_y$ becomes higher, and as a result, the gate insulating film 11 cannot serve as an insulating film.

A range of $0.87 \le 0.59 \le x+y \le 0.93$ enclosed by the upper dotted line and the lower dotted line in FIG. 3 is determined considering variation in the composition ratio as described above. Therefore, the threshold voltage shift amount $\Delta V$ in the composition ratio of nitrogen to oxygen y/x of a rectangle region S can be considered as the shift amount $\Delta V$ of plot point 5. The rectangle region S is defined by four straight lines: the straight line passing the above first point A and perpendicular to the lower dotted line, the straight line passing the above second point B and perpendicular to the upper dotted line, the lower dotted line, and the upper dotted line.

The threshold voltage shift amount $\Delta V$ in the composition ratio of nitrogen to oxygen y/x on the straight line of $0.59x+y=0.9$ (thick bold line) exists on a curve passing the points shown in FIG. 4. The threshold voltage shift amount is low, i.e., not larger than 0.5 V for the plot points 1 to 7 and not larger than 0.2 V for the plot points 3 to 6. Therefore, the composition ratio of nitrogen to oxygen y/x on the straight line is supposed to give a local minimum value of shift amount $\Delta V$ for a variation in the composition ratio of nitrogen to oxygen y/x in a direction perpendicular to the straight line of $0.59x+y=0.9$ (thick solid line).

When the threshold voltage shift amount at any point on the straight line of $0.59x+y=0.9$ (thick solid line) is defined as $\Delta V$ in a range of $0.8 \le 0.59x+y \le 1.0$ (enclosed by the lower thin solid line and the upper thin solid line), the fluctuation range of shift amount for a variation in the nitrogen composition ratio and the oxygen composition ratio in a direction perpendicular to the straight line is assumed to be $1.2\Delta V$ or less. That is, the maximum value of the shift amount for a variation in the composition ratio in a direction perpendicular to the thick solid line is assumed to be 0.6 V for the plot point 7 with the shift amount of 0.5 V, 0.24 V for the plot point 6 with the shift amount of 0.2 V, and 0.06 V or less for the plot points 3 to 5 with the shift amounts of 0.05 V or less. In this way, the above ±0.1 range of the nitrogen composition ratio for the straight line of $0.59x+y=0.9$ was determined as a range that the shift amount is assumed to be $1.2\Delta V$ or less. Therefore, in the range of $0.8 \le 0.59x+y \le 1.0$, and $0.8 \le y/x \le 10$, the threshold voltage shift amount is 0.6V or less.

The range of the oxygen composition ratio x and the nitrogen composition ratio y, more preferably, satisfy the relation: $0.8 \le 0.59x+y \le 1.0$, and $1 \le y/x \le 4$ or $0.2 \le x < 0.5$. The plot points 3, 4, 5, and 6 belong to this range. In this range, the ratio of oxygen gas flow rate/nitrogen gas flow rate is 0.0588 (plot point 3) to 0.1412 (plot point 6), and the ratio of nitrogen to oxygen y/x is 1.2 to 3.7. Within these ranges, as is clear from FIG. 4, the threshold voltage shift amount $\Delta V$ can be suppressed to 0.2 V or less in the composition ratio on the straight line of $0.59x+y=0.9$, and the MIS-type semiconductor device according to Embodiment 1 can perform more stable operation. Particularly, in the range where $0.8 \le 0.59x+y \le 1.0$ is satisfied, and $1.5 \le y/x \le 4$ or $0.2 \le x \le 0.43$ ($1.59 \le y/x \le 3.67$ or $0.21 \le x \le 0.41$ as the range including the plot points 3, 4, and 5) is satisfied, the threshold voltage shift amount $\Delta V$ was 0.05 V or less in the composition ratio on the straight line of $0.59x+y=0.9$. In the range including the plot points 3, 4, and 5, the ratio of oxygen gas flow rate/nitrogen gas flow rate is 0.0588 (plot point 3) to 0.1176 (plot point 5), and the ratio of nitrogen to oxygen y/x is 1.6 to 3.7.

The MIS-type semiconductor device of the present invention is not limited to the structure shown in Embodiment 1, and any structure having a gate insulating film and a gate electrode in this order on the semiconductor layer may be employed.

In the MIS-type semiconductor device according to Embodiment 1, the gate insulating film 11 is a single layer. However, if it is formed of $ZrO_xN_y$ satisfying the above range of x and y, it may comprise a plurality of layers having different oxygen composition ratios x and nitrogen composition ratios y.

Embodiment 2

Figure 5:
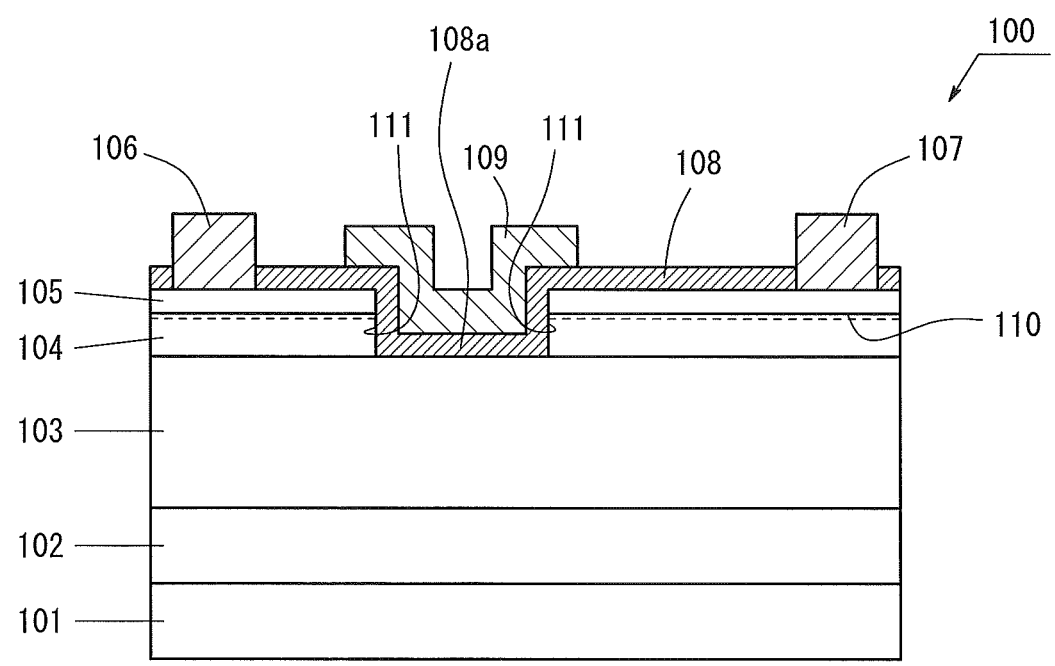
FIG. 5 is a sketch showing the structure of a MISHFET according to Embodiment 2.

FIG. 5 is a sketch showing the structure of a MISHFET according to Embodiment 2.

The MISHFET 100 includes a Si substrate 101 and a first carrier transport layer 103 formed of undoped GaN disposed via an AlN buffer layer 102 on the substrate 101.

Moreover, two separate second carrier transport layers 104 formed of undoped GaN are provided on two regions separated on the first carrier transport layers 103, and two separate carrier supply layers 105 formed of $Al_{0.25}Ga_{0.75}N$ are disposed respectively on the two separate second carrier transport layers 104. The second carrier transport layer 104 and the carrier supply layer 105 form a heterojunction therebetween. The second carrier transport layer 104 and the carrier supply layer 105 are respectively formed through selective crystal re-growth.

A source electrode 106 is formed on one of the two separate carrier supply layers 105 and a drain electrode 107 is formed on the other carrier supply layer 105. Each of the source electrode 106 and the drain electrode 107 is formed of Ti/Al (in the order of Ti and Al on the carrier supply layer 105).

An insulating film 108 formed of microcrystalline $ZrO_xN_y$ (x and y satisfy the relation: x>0, y>0, $0.8 \leq y/x \leq 10$, and $0.8 \leq 0.59x+y \leq 1.0$) is provided on a region of the first carrier transport layer 103 which is located between two stacked structures each including the second carrier transport layer 104 and the carrier supply layer 105, and on which the second carrier transport layer 104 is not formed. The insulating film 108 is also provided on two mutually facing lateral end surfaces 111 of the two stacked structures each including the second carrier transport layer 104 and the carrier supply layer 105, and is also provided on the carrier supply layers 105.

A gate electrode 109 is provided, via the insulating film 108, on a region of the first carrier transport layer 103 on which the second carrier transport layer 104 is not provided and on the two lateral end surfaces 111. The gate electrode 109 is formed of Ni/Au (in the order of Ni and Au on the insulating film 108). The gate electrode 109 is also provided, via the insulating film 108, on the carrier supply layers 105 in the vicinity of the lateral end surfaces 111 such that the gate electrode 109 extends 0.5 μm from the lateral end surfaces 111 toward the source electrode 106 and the drain electrode 107, respectively. When the gate electrode is provided so as to extend in this manner, in the case where positive voltage is applied to the gate electrode 109, a larger amount of electrons can be accumulated in the vicinity of the lateral end surfaces 111, and the concentration of 2DEG can be further increased in a region located below the thus-extended gate electrode 109. Therefore, on-state resistance can be further reduced.

The first carrier transport layer 103 has a thickness of 2 μm, the second carrier transport layer 104 has a thickness of 100 nm, and the carrier supply layer 105 has a thickness of 25 nm. The insulating film 108 has a thickness of 40 nm. A distance between the source electrode 106 and the gate electrode 109 is 1.5 μm, a distance between the gate electrode 109 and the drain electrode 107 is 6.5 μm, i.e., the MISHFET 100 has an asymmetric configuration in which the gate electrode 109 is provided proximal to the source electrode 106. Thus, the gate electrode 109 is located nearer to the source electrode 106 than to the drain electrode 107 for the purpose of improving breakdown voltage.

The substrate 101 may be formed of, in place of Si, any known material which has been conventionally used in a growth substrate for a Group III nitride semiconductor, for example, sapphire, SiC, ZnO, spinel, or GaN.

The buffer layer 102 may be formed of GaN, in place of AlN, or may comprise a plurality of layers such as AlN/GaN.

Moreover, the first carrier transport layer 103 may be formed of Group III nitride semiconductor having any composition ratio. However, it is preferably formed of GaN in terms of crystallinity and others. The first carrier transport layer 103 may be doped with an n-type impurity, or may comprise a plurality of layers. The first carrier transport layer 103 may be formed directly on the substrate 101 without forming the buffer layer 102.

The second carrier transport layer 104 is formed of GaN, and the carrier supply layer 105 is formed of AlGaN. However, the second carrier transport layer 104 and the carrier supply layer 105 may be formed of any Group III nitride semiconductor as long as the bandgap of the Group III nitride semiconductor of the carrier supply layer 105 is larger than that of the Group III nitride semiconductor of the second carrier transport layer 104. For example, the second carrier transport layer 104 may be formed of InGaN, and the carrier supply layer 105 may be formed of GaN or AlGaN. The carrier supply layer 105 may be doped with impurity such as Si (i.e., n-type). The carrier supply layer 105 may have a cap layer thereon. The second carrier transport layer 104 and the first carrier transport layer 103 may be formed of Group III nitride semiconductor having the same composition ratios or different composition ratios.

By virtue of the heterojunction formed between the second carrier transport layer 104 and the carrier supply layer 105, a 2DEG layer (a portion shown by a dotted line in FIG. 5) is formed in the vicinity of the heterojunction interface 110 between the second carrier transport layer 104 and the carrier supply layer 105 and on the second carrier transport layer 104. The second carrier transport layer 104 and the carrier supply layer 105 are formed on two regions separated by the gate electrode 109. Therefore, the 2DEG layer is formed in two separate regions; i.e., a region in which the source electrode 106 is formed on the carrier supply layer 105 (source-gate region) and a region in which the drain electrode 107 is formed on the carrier supply layer 105 (gate-drain region).

Each of the source electrode 106 and the drain electrode 107 is in ohmic contact with the second carrier transport layer 104 via the carrier supply layer 105 by means of the tunnel effect. Each of the source electrode 106 and the drain electrode 107 may be formed of, for example, Ti/Au in place of Ti/Al. Each electrode may be formed of a material for providing Schottky Contact, but such a material is not preferred in order to reduce the on-resistance. For the purpose of attaining good ohmic contact, a region of the carrier supply layer 105 or the second carrier transport layer 104 directly below the source electrode 106 or the drain electrode 107 may be doped with Si at high concentration, or the thickness of the carrier supply layer 105 directly below the source electrode 106 or the drain electrode 107 may be reduced.

The insulating film 108 serves as both a gate insulating film and a protective film. The gate insulating film is the film of a region 108a of the insulating film 108, which is enclosed by the first carrier transport layer 103, the second carrier transport layer 104, the carrier supply layer 105, and the gate electrode 109. Needless to say, the insulating film may not serve as both a gate insulating film and a protective film. The protective film may be formed of other material, as long as the gate insulating film is formed of microcrystalline $ZrO_xN_y$ (x and y satisfy the relation: x>0, y>0, $0.8 \leq y/x \leq 10$, and $0.8 \leq 0.59x+y \leq 1.0$).

When the protective film is formed of other material, $SiO_2$, $SiN_x$, $Al_2O_3$, $HfO_2$, $ZrO_2$, AlN or similar materials can be used. Although the insulating film 108 is a single layer, a portion or the entirety of the insulating film 108 may comprise a plurality of layers including a microcrystalline $ZrO_xN_y$ layer satisfying the above x and y relation.

The gate electrode 109 may be formed of, for example, Ti/Al, W or polysilicon in place of Ni/Au.

The operation of the MISHFET 100 according to Embodiment 2 will be described. In the MISHFET 100, when bias voltage is not applied to the gate electrode 109, the 2DEG layers separated in the source-gate region and the gate-drain region are not electrically connected. Therefore, current does not flow between the source electrode and the drain electrode (i.e., OFF state). Thus, the MISHFET 100 exhibits a normally-off characteristic. Meanwhile, when a bias voltage equal to or higher than the threshold voltage is applied to the gate electrode 109 is applied, electrons are accumulated in a region which is in contact with the gate electrode 109 via the insulating film 108, specifically, in the vicinity of the surface of the first carrier transport layer 103 on which the second carrier transport layer 104 is not formed, and in the vicinity of mutually facing lateral end surfaces 111 of the second carrier transport layer 104 and the carrier supply layer 105. By means of the thus-accumulated electrons, the 2DEG layer located in the source-gate region is electrically connected to the 2DEG layer located in the gate-drain region. As a result, current flows between the source electrode and the drain electrode (i.e., ON state).

In the MISHFET 100, since the second carrier transport layer 104 is selectively re-grown on the first carrier transport layer 103, impurities are incorporated at the interface between the first carrier transport layer 103 and the second carrier transport layer 104. However, the amount of re-growth associated impurities contained in the second carrier transport layer 104 is reduced in accordance with increasing distance from the interface between the first carrier transport layer 103 and the second carrier transport layer 104. Therefore, virtually no re-growth associated impurities are observed at the heterojunction interface 110 between the second carrier transport layer 104 and the carrier supply layer 105. Since the carrier supply layer 105 is continuously grown on the second carrier transport layer 104 after re-growth of the second carrier transport layer 104, flatness of the heterojunction interface 110 between the second carrier transport layer 104 and the carrier supply layer 105 is higher than that of the heterojunction interface between the first carrier transport layer 103 and the carrier supply layer 105 in the case where the carrier supply layer 105 is grown directly on the first carrier transport layer 103. Therefore, there is no reduction in the mobility of 2DEG generated in the vicinity of the heterojunction interface 110 between the second carrier transport layer 104 and the carrier supply layer 105 and on the side of the second carrier transport layer 104. Thus, the MISHFET 100 according to Embodiment 2 exhibits a normally-off characteristic and low on-state resistance.

In order to sufficiently reduce the amount of re-growth associated impurities at the heterojunction interface between the second carrier transport layer 104 and the carrier supply layer 105, as well as to improve flatness of the interface, the thickness of the second carrier transport layer 104 is preferably 50 nm or more.

In the MISHFET 100, the thickness of the insulating film 108 is adjusted to be smaller than that of the second carrier transport layer 104 so that that the level of the top surface of the region 108a in the insulating film 108 formed on the first carrier transport layer 103 is below that of the heterojunction interface 110 between the second carrier transport layer 104 and the carrier supply layer 105, that is the top surface of the region 108a is nearer to the first carrier transport layer 103 than the heterojunction interface 100 is. With this structure, when positive voltage is applied to the gate electrode 109, a larger amount of electrons can be accumulated in the vicinity of the two lateral end surfaces 111. As a result, on-state resistance can be further reduced.

In the MISHFET 100, the gate insulating film (the region 108a of the insulating film 108, which is enclosed by the first carrier transport layer 103, the second carrier transport layer 104, and the carrier supply layer 105, and the gate electrode 109) is formed of microcrystalline $ZrO_xN_y$ (x and y satisfy the relation: $x>0$, $y>0$, $0.8 \leq y/x \leq 10$, and $0.8 \leq 0.59x+y \leq 1.0$). Therefore, even if the gate applied voltage of the MISHFET 100 is 5 V or more, the threshold value does not shift, thereby achieving stable operation.

Next will be described a method for producing a MISHFET 100 according to Embodiment 2 with reference to the drawings.

Figure 6A:
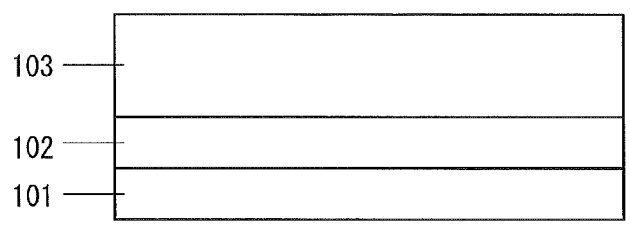
FIGS. 6A to 6E are sketches showing processes for producing the MISHFET according to Embodiment 2.

Firstly, an AlN buffer layer 102 was formed on a Si substrate 101 through MOCVD. Subsequently, a first carrier transport layer 103 of undoped GaN was formed on the buffer layer 102 through MOCVD (FIG. 6A). The gases employed were as follows: hydrogen and nitrogen as carrier gases, ammonia gas as a nitrogen source, TMG (trimethylgallium) as a Ga source, and TMA (trimetylaluminum) as an Al source.

Figure 6B:
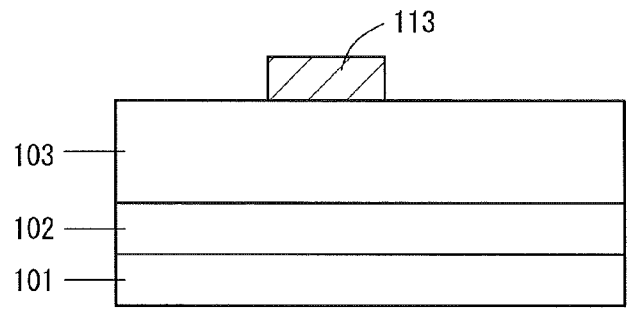

Subsequently, a mask 113 of $SiO_2$ was formed on a specific region of the first carrier transport layer 103 through CVD, and the mask 113 was not formed on two regions separated by the mask 113, to thereby expose the surface of the first carrier transport layer 103 (FIG. 6B). No particular limitation is imposed on the material of the mask 113, as long as the material inhibits growth of a Group III nitride semiconductor. The mask may be formed of, in place of $SiO_2$ film, an insulating film of, for example, $Si_3N_4$, $Al_2O_3$, $HfO_2$, or $ZrO_2$.

Figure 6C:
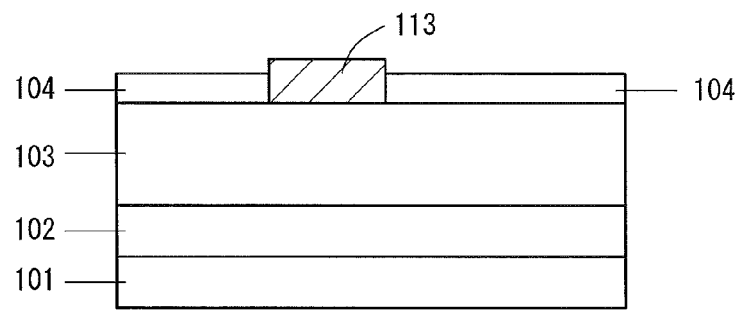

Next, a second carrier transport layer 104 formed of undoped GaN was re-grown on the first carrier transport layer 103 through MOCVD. Since GaN is not grown on the mask 113, the second carrier transport layer 104 is selectively re-grown only on the two regions separated by the mask 113 (FIG. 6C). During this regrowth, flatness of the interface between the first carrier transport layer 103 and the second carrier transport layer 104 is degraded, and impurities are incorporated at the interface. However, as growth of the second carrier transport layer 104 proceeds, flatness of the growing surface of the second carrier transport layer 104 is improved, and density of the re-growth associated impurities on the growing surface is decreased.

Figure 6D:
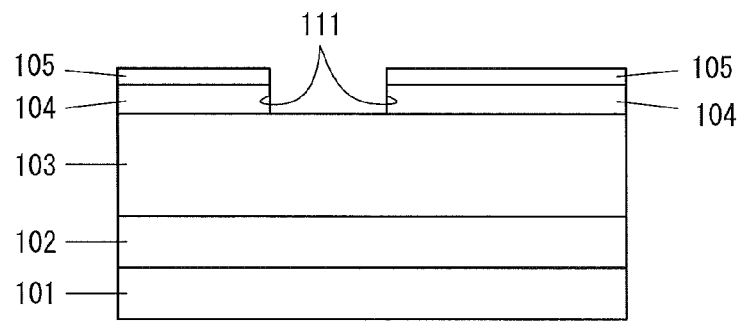

After the second carrier transport layer 104 has been grown so as to have a specific thickness, a carrier supply layer 105 of $Al_{0.25}Ga_{0.75}N$ was successively grown thereon through MOCVD. During this growth process, crystal growth on the mask 113 is also inhibited. Therefore, the carrier supply layer 105 is selectively grown only on the two second carrier transport layers 104. When the growth of the carrier supply layer 105 is started, flatness of the surface of the second carrier transport layer 104, on which the carrier supply layer 105 is grown, has been already improved, and density of impurities on the surface has been decreased substantially to zero. Therefore, flatness of the heterojunction interface between the second carrier transport layer 104 and the carrier supply layer 105 is high, and virtually no re-growth associated impurities are observed in the vicinity of the interface. After the carrier supply layer 105 has been grown so as to have a specific thickness, the mask 113 was removed (FIG. 6D).

Figure 6E:
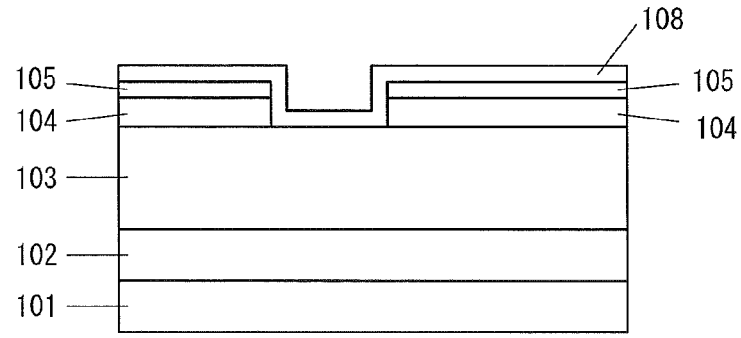

Subsequently, an insulating film 108 of microcrystalline $ZrO_xN_y$ (x and y satisfy the relation: x>0, y>0, 0.8≤y/x≤10, and 0.8≤0.59x+y≤1.0) was formed on a region of the first carrier transport layer 103 on which the second carrier transport layer 104 was not formed, on two mutually facing lateral end surfaces 111 of two separate stacked structures each including the second carrier transport layer 104 and the carrier supply layer 105 (FIG. 6E). The insulating film 108 serves as both a gate insulating film and a protective film of the carrier supply layer 105 for common use, to thereby reduce the number of production processes.

Here, the insulating film 108 is formed by ECR sputtering method, in a mixture gas of nitrogen and oxygen mixed in argon gas, using a Zr metal target. The substrate temperature is room temperature, the pressure is 0.07 Pa to 0.2 Pa, the RF power is 500 W, and the microwave power is 500 W. The argon gas flow rate is 15 sccm to 30 sccm, the oxygen gas flow rate is 0.1 sccm to 3.0 sccm, and the nitrogen gas flow rate is 4.3 sccm to 7 sccm. The oxygen composition ratio and the nitrogen composition ratio of the gate insulating film 11 can be adjusted by the oxygen gas flow rate and the nitrogen gas flow rate, respectively. Under these conditions, the insulating film 108 of microcrystalline $ZrO_xN_y$ (x and y satisfy the relation: x>0, y>0, 0.8≤y/x≤10, and 0.8≤0.59x+y≤1.0) can be formed.

Then, after the formation of the gate insulating film 11, heat treatment was performed at 400° C. for 30 minutes in a nitrogen atmosphere with the surface of the gate insulating film 11 exposed. Preferable temperature range and time range are the same as those in Embodiment 1.

Subsequently, the insulating film 108 was removed from so as to expose regions of the carrier supply layer 105 on which a source electrode 106 and a drain electrode 107 are formed, and the source electrode 106 and the drain electrode 107 were formed on the thus-exposed regions of the carrier supply layer 105 through vapor deposition and lift-off process. A gate electrode 109 was formed on a portion of the insulating film 108, through vapor deposition and lift-off process, the portion including an area above a region of the first carrier transport layer 103 on which the second carrier transport layer 104 is not provided; two front areas of the two lateral end surfaces 111; and an area above the carrier supply layer 105 in the vicinity of the lateral end surfaces 111. Thus, the MISHFET 100 shown in FIG. 1 was produced.

In the MISHFET 100 produced through this production method, flatness of the heterojunction interface between the second carrier transport layer 104 and the carrier supply layer 105 is improved, and virtually no re-growth-associated impurities are observed in the vicinity of the interface. Therefore, the MISHFET 100 exhibits a normally-off characteristic, and low on-state resistance. The insulating film 108 can be formed of microcrystalline $ZrO_xN_y$ (x and y satisfy the relation: x>0, y>0, 0.8≤y/x≤10, and 0.8≤0.59x+y≤1.0). Therefore, even if the gate applied voltage of the MISHFET 100 is 5 V or more, the threshold value does not shift, thereby achieving stable operation. The ranges described in Embodiment 1 can be applied as the preferable ranges of oxygen composition ratio x and nitrogen composition ratio y, and ratio of nitrogen to oxygen y/x in the insulating film 108 (gate insulating film) of the MISHFET according to Embodiment 2. In this case, the threshold voltage shift amount Δ V can be suppressed to 0.5 V, 0.2 V, and 0.05 V or less according to those ranges as described in Embodiment 1.

In the aforementioned production method for the MISHFET 100, the mask 113 employed for selective crystal growth is removed after the formation of the carrier supply layer 105. However, the mask 113 may be formed of microcrystalline $ZrO_xN_y$ (x and y satisfy the relation: x>0, y>0, 0.8≤y/x≤10, and 0.8≤0.59x+y≤1.0), and be left as a gate insulating film.

Embodiment 3

Figure 7:
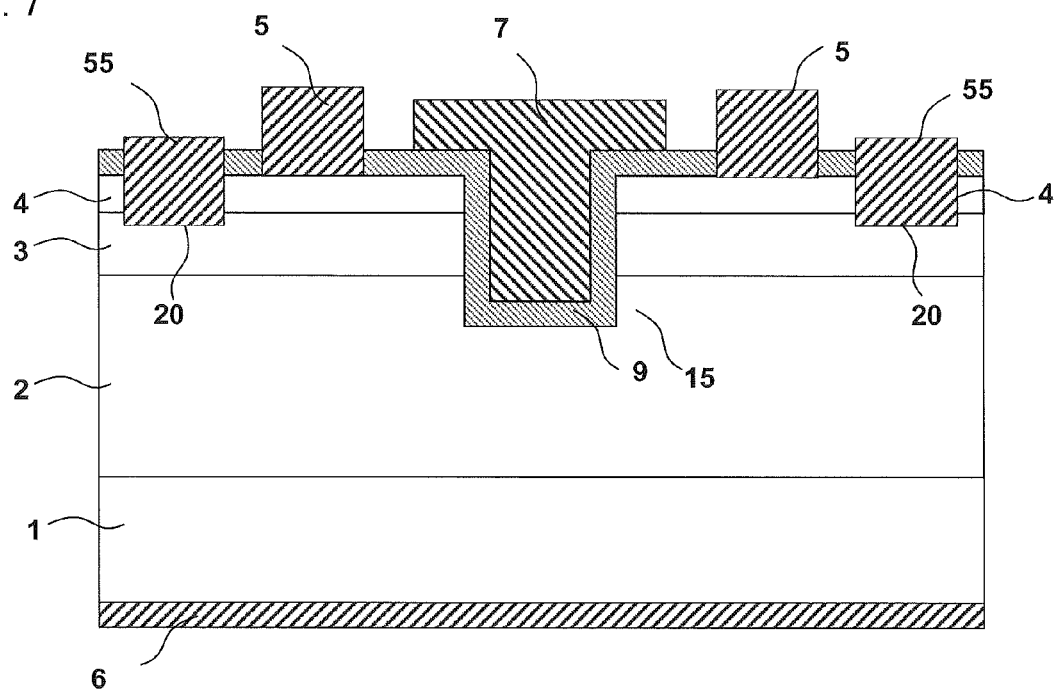
FIG. 7 is a sketch showing the structure of a vertical MISFET according to Embodiment 3.

FIG. 7 is a cross-sectional view showing the structure of a vertical MIS transistor. Embodiment 3 is a trench type GaN MISFET. An n⁻ layer 2, a p-type layer 3, and an n⁺ layer 4 were crystal grown on the n-type GaN substrate 1 through MOCVD. Si can be used as a donor dopant of the n-type layer, and Mg can be used as an acceptor dopant of the p-type layer. A gate trench (recess) 15 and recess regions (recesses) 20 becoming p-contact regions were formed through dry etching using a Cl-based gas. The side surfaces of the trench and recess region are not necessarily vertical, and may be inclined.

Thereafter, a gate insulating film 9 of $ZrO_xN_y$ (x and y satisfy the relation: x>0, y>0, 0.8≤y/x≤10, and 0.8≤0.59x+y≤1.0) was formed by ECR sputtering so as to have a thickness of 40 nm, and heat treatment was performed at 400° C. for 30 minutes in a nitrogen atmosphere. The conditions described in Embodiments 1 and 2 can be applied as the production conditions such as oxygen gas flow rate and nitrogen gas flow rate of the gate insulating film 9.

After a source electrode 5 was formed so as to connect to the n⁺ layer 4, a body electrode 55 was formed so as to connect the p-type layer 3, and heat treatment was performed to reduce the contact resistance. Heat treatment may be separately performed. That is, after the formation of the source electrode 5, heat treatment may be performed for the source electrode 5. Then, after the formation of the body electrode 55, heat treatment may be performed for the body electrode 55. The source electrode 5 and the body electrode 55 may be formed in the reverse order. Thereafter, a gate electrode 7 was formed. Finally, a drain electrode 6 was formed on the rear surface of the n-type GaN substrate 1, and heat treatment was performed to reduce the contact resistance.

The source electrode 5 is formed of Al/Ti (Ti is on the n⁺ layer side), the body electrode 55 is formed of Au/Pd, the drain electrode 6 is formed of Al/Ti (Ti is on the n-type substrate 1 side), and the gate electrode 7 is formed of Al/TiN (TiN is on the gate insulating film 9 side).

Figure 8:
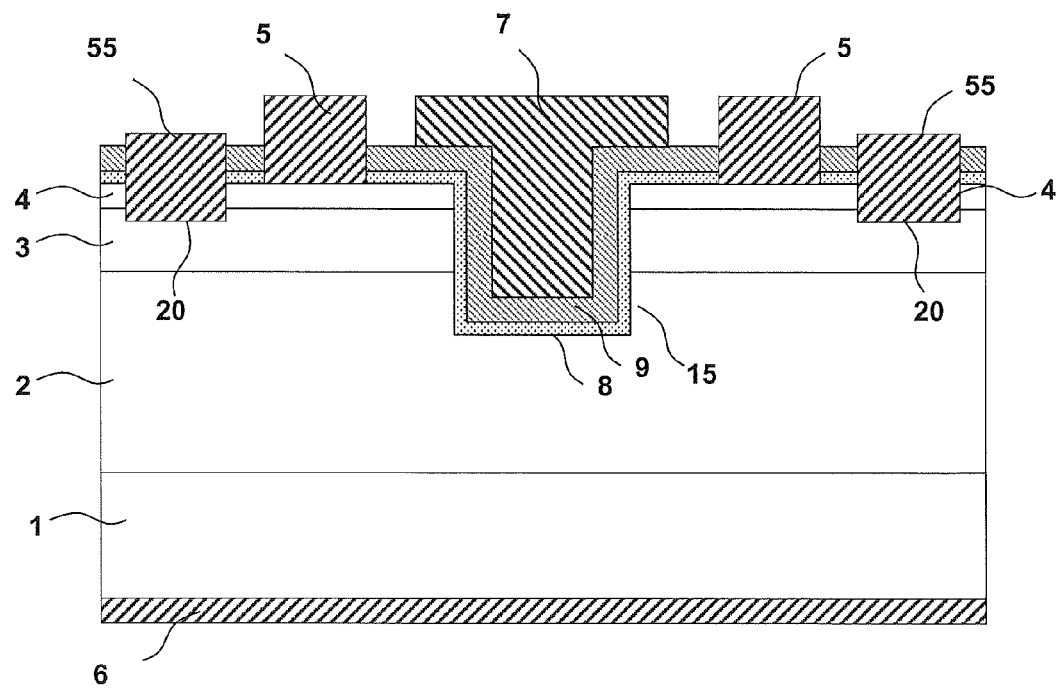
FIG. 8 is a sketch showing the structure of a vertical MISFET according to variation of Embodiment 3.

In the vertical MIS transistor according to Embodiment 3 shown in FIG. 7, a gate insulating film 8 of $SiO_2$ may be formed through ALD on the n⁻ layer 2 constituting the trench 1, the lateral end surfaces of the p-type layer 3 and the n⁺ layer 4 exposed in the trench 15, and the top surface of the n⁺ layer 4. Subsequently, a $ZrO_xN_y$ gate insulating film 9 of the present invention may be formed by ECR sputtering on the gate insulating film 8 (FIG. 8). That is, as shown in FIG. 8, the gate insulating film may have a two-layer structure of the gate insulating film 8 of $SiO_2$ different from $ZrO_xN_y$, and the gate insulating film 9 of $ZrO_xN_y$ stacked in this order on the semiconductor layer. In this case as well, heat treatment is performed at 400° C. for 30 minutes in a nitrogen atmosphere with the surface of the gate insulating film 9 exposed. The preferable temperature range and time range are the same as those described in Embodiments 1 and 2.

The ranges described in Embodiments 1 and 2 can be applied as the preferable ranges of oxygen composition ratio x and nitrogen composition ratio y, and ratio of nitrogen to oxygen y/x in the gate insulating film 9 of the vertical MIS transistor according to Embodiment 3 shown in FIGS. 7 and 8. In that case, the threshold voltage shift amount Δ V can be suppressed to 0.5 V, 0.2 V, and 0.05 V or less according to those ranges as described in Embodiment 1.

The gate insulating film 8 may be formed of SiN, SiON, and $Al_2O_3$ in place of $SiO_2$. In addition, the gate insulating film 8 may have a two-layer structure of $Al_2O_3$ and $SiO_2$ stacked in this order on the semiconductor layer, two-layer structure of AlON and SiN stacked in this order on the semiconductor layer, and three or more layer structure of other layers.

In Embodiments 1 to 3, a GaN transistor was used. However, the transistor may be formed of other semiconductor material such as Si, GaAs, InP, and SiC.

In Embodiment 3, the vertical trench MIS transistor was described. However, the present invention can be applied to a vertical planar MISFET. The present invention can be applied to all semiconductor devices such as lateral MISFET, MISHFET, and IGBT as long as it has an insulating gate structure.

[Analysis Result of $ZrO_xN_y$]

The element distribution in a depth direction was analyzed with respect to the composition of the gate insulating film used in all the above embodiments. The composition analysis in the depth direction of $ZrO_xN_y$ was obtained by a combination of RBS and XPS as described above. The standard sample was measured by RBS, and the sensitivity coefficients for quantitative analysis of Zr, O, and N in XPS were calculated using the average composition value obtained by RBS. Samples produced under different film formation conditions were measured by XPS, and the compositions were obtained.

Figure 9:
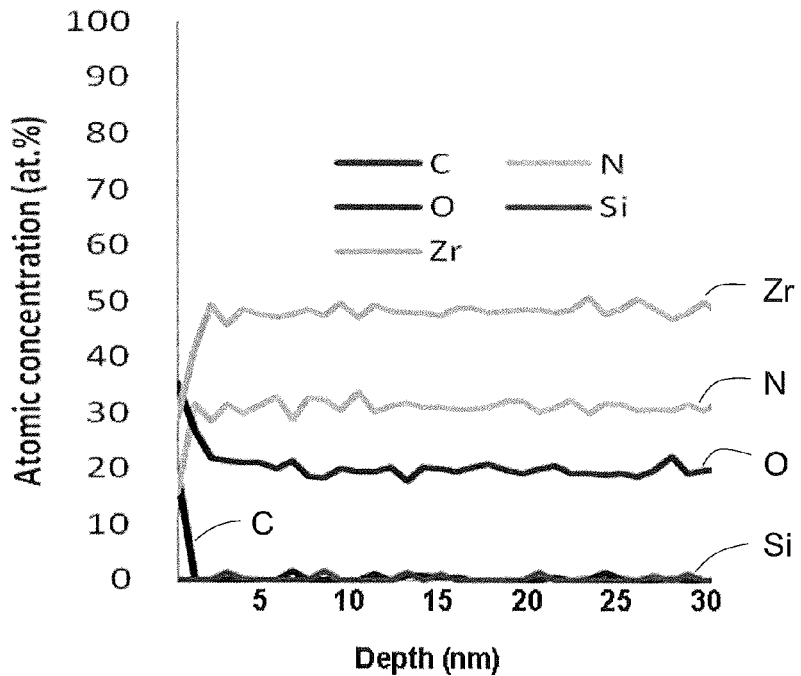
FIG. 9 is a measurement diagram showing the distribution of elements with respect to depth direction from the surface of the gate insulating film.

FIG. 9 shows the measurement results of the gate insulating film of $ZrO_xN_y$, which was formed under the conditions: the nitrogen gas flow rate is 8.5 sccm, the oxygen gas flow rate is 1.0 sccm, the ratio of oxygen gas flow rate/ nitrogen gas flow rate is 0.1176, x is about 0.41, and y is 0.65 (plot 5 of FIG. 3). After the film formation, this gate insulating film was subjected to heat treatment at 400° C. for 30 minutes with the surface thereof exposed in a nitrogen gas atmosphere. Depth 0 of the gate insulating film on the vertical axis indicates the position of the surface of the gate insulating film (the surface on which the gate electrode is formed). The depth direction is a direction toward the semiconductor layer.

The measurement results revealed that in the surface layer in the vicinity of the $ZrO_xN_y$ film surface (with a depth of approximately 2 nm from the surface), the oxygen composition ratio x is higher and the nitrogen composition ratio y is lower than in other portions of the gate insulating film (with a depth of more than 2 nm from the surface). In the uppermost surface of the surface layer, the oxygen composition ratio x of $ZrO_xN_y$ was about 1.17, and the nitrogen composition ratio y was about 0.48. In the gate insulating film (portions with a depth of 2 nm or more from the uppermost surface), the oxygen composition ratio x was about 0.41, and the nitrogen composition ratio y was about 0.65, which were almost constant regardless of depth. In the surface layer, as the depth from the uppermost surface increases, the oxygen composition ratio x is decreased, and the nitrogen composition ratio y is increased. The oxygen composition ratio x was high in the surface layer because the above heat treatment was performed after the formation of the gate insulating film. The composition in the uppermost surface corresponds to $ZrO_{1.2}N_{0.5}$. That is, the oxygen composition ratio is increased from the average value of 0.41 in a thickness direction of the gate insulating film (except for the surface layer) (hereinafter, referred to just as "average value") to the oxygen composition ratio of 1.2 in the uppermost surface of the surface layer. Moreover, the nitrogen composition ratio is decreased from the average value of 0.65 to the nitrogen composition ratio of 0.5 in the uppermost surface of the surface layer. In other words, the ratio of nitrogen to oxygen y/x (v/u) is decreased from the average value of 1.6 to the y/x (v/u) of 0.41 in the uppermost surface of the surface layer. The distribution characteristics of elements in FIG. 9 were also observed in the gate insulating film having different composition ratios (plot points 1-8). Therefore, it is understood that the surface layer formed by heat treating the gate insulating films of the plot points 1-8 in FIG. 3, have the above-mentioned distribution of oxygen composition ratio and nitrogen composition ratio.

A high oxygen composition ratio x in the surface layer makes a bandgap wider, thereby increasing the insulation. Therefore, the gate current flowing when a gate voltage was applied to the gate insulating film, that is, the leakage current of the insulating film could be more suppressed. From the comparison of the leakage currents when the same gate voltage was applied in a device in which a surface layer having a high oxygen composition ratio x was not formed without performing heat treatment and a device in which a surface layer having a high oxygen composition ratio x was formed by performing heat treatment, it was found that the leakage current of the device in which the surface layer having a high oxygen composition ratio x was formed was lower by about one digit than that of the device in which the surface layer having a high oxygen composition ratio x was not formed.

Figure 10:
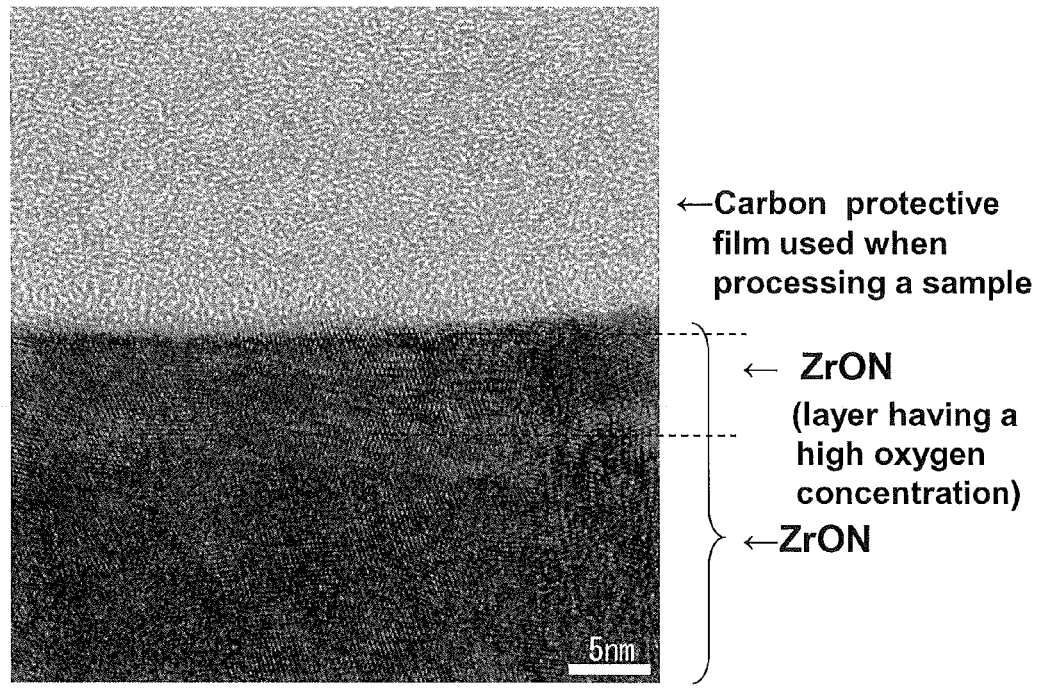
FIG. 10 is a cross-sectional TEM image of the gate insulating film heat treated after film formation.

After the formation of the $ZrO_xN_y$ film, annealing was performed at 400° C. for 60 minutes with the surface exposed in a nitrogen atmosphere. FIG. 10 shows the TEM image of the $ZrO_xN_y$ films at that time. It is understood that the thickness of the surface layer having a high oxygen composition ratio x is increased by performing heat treatment for 60 minutes. The thickness of the surface layer having a high oxygen composition ratio x was 6 nm. Therefore, the thickness of the surface layer having a high oxygen composition ratio x can be increased by increasing the heat treatment time after the film formation. Moreover, the oxygen composition ratio x and the thickness of the surface layer can be increased by increasing the heat treatment temperature.

In the above examples, in the surface layer, the oxygen composition ratio x is decreased as the depth is increased. However, the oxygen composition ratio may be constant and higher than the oxygen composition ratio x of the gate insulating film without inclination change in the composition ratio. In this case, the gate leakage current can be suppressed.

In the above embodiments, since the surface layer having a high oxygen composition ratio x in the gate insulating film is formed by performing heat treatment, the surface layer is formed integrally with the gate insulating film. However, the gate insulating film may be formed by increasing step by step or gradually increasing the oxygen gas flow rate in the surface layer. In this case, the gate insulating film is continuously formed in the same sputtering device. In this way as well, the gate leakage current can be reduced.

In the present invention, the gate insulating film is not necessarily formed by performing heat treatment and the surface layer having a high oxygen composition ratio may not be formed. When the surface layer having a high oxygen composition ratio was formed by performing heat treatment, the gate leakage current can be effectively suppressed. In the above Embodiments 1, 2, and 3, after the formation of the gate insulating film, heat treatment is performed. As described in the above [Analysis results of $ZrO_xN_y$], the surface layer is formed so that the oxygen composition ratio up to a depth of 2 nm from the surface is higher than that at the center of the thickness of the gate insulating film. When the thickness of this surface layer is 1 nm or more, preferably, 2 nm or more, the gate leakage current can be effectively suppressed. However, when the surface layer is excessively thick, the effect of suppressing the threshold voltage shift amount Δ V by appropriately setting the oxygen composition ratio x and the nitrogen composition ratio y of the $ZrO_xN_y$ gate insulating film is reduced. It is not preferable. Therefore, preferably, the thickness of the surface layer is 1 nm or more, and is smaller than the thickness of the gate insulating film excluding the surface layer. The thickness of the gate insulating film excluding the surface layer is, preferably, 10 nm to 1 μm. Moreover, the surface layer is, preferably, 1 nm to 10 nm, more preferably, 2 nm to 10 nm.

The MIS-type semiconductor device of the present invention is suitable for a power device such as MISFET and MISHFET.

What is claimed is:

1. A MIS-type transistor comprising:
   a gate insulating film formed of ZrOxNy on a semiconductor layer and a gate electrode on the gate insulating film, with a gate applied voltage of 5 V or more,
   wherein an oxygen composition ratio x and a nitrogen composition ratio y of the gate insulating film satisfy x>0, y>0, 0.8≤y/x≤10, and 0.8≤0.59x+y≤1.0,
   wherein a ZrOuNv surface layer is continuously formed on and directly contacted with the gate insulating film and an oxygen composition ratio u of the ZrOuNv surface layer is higher than the oxygen composition ratio x of the gate insulating film, and the ZrOuNv surface layer directly contacts the gate electrode,
   wherein the oxygen composition ratio u of the ZrOuNv surface layer is continuously increased as it is closer to the gate electrode in a thickness direction, and
   wherein the nitrogen composition ratio v of the ZrOuNv surface layer is continuously decreased as it is closer to the gate electrode in a thickness direction.

2. The MIS-type transistor according to claim 1, wherein the thickness of the $ZrO_UN_V$ surface layer is 1 nm or more, and is smaller than the thickness of the gate insulating film.

3. The MIS-type transistor according to claim 1, wherein the oxygen composition ratio u of the $ZrO_UN_V$ surface layer is 2 or less.

4. The MIS-type transistor according to claim 3, wherein a nitrogen composition ratio v of the $ZrO_UN_V$ surface layer satisfies 0≤v≤0.5.

5. The MIS-type transistor according to claim 1, wherein the oxygen composition ratio u and the nitrogen composition ratio v of the $ZrO_UN_V$ surface layer satisfy 0.8≤v/u≤10, and 0.8≤0.59u+v≤1.0.

6. The MIS-type transistor according to claim 1, wherein the $ZrO_UN_V$ surface layer is formed by annealing in a nitrogen atmosphere with the surface of the gate insulating film exposed after the film formation.

7. The MIS-type transistor according to claim 1, wherein the gate insulating film is microcrystalline.

8. The MIS-type transistor according to claim 1, wherein other insulating film having a different composition from that of the gate insulating film is formed between the gate insulating film and the semiconductor layer.

9. The MIS-type transistor according to claim 1, wherein the semiconductor layer is a Group III nitride semiconductor layer.

10. The MIS-type transistor according to claim 1, wherein the oxygen composition ratio x and the nitrogen composition ratio y of the gate insulating film satisfy 1≤y/x≤4.

11. The MIS-type transistor according to claim 1, wherein the oxygen composition ratio x of the gate insulating film satisfies 0.2≤x<0.5.

12. The MIS-type transistor according to claim 1, wherein the MIS-type transistor is a vertical MISFET, the MIS-type transistor comprising:
   a substrate;
   an n⁻ layer formed on the substrate;
   a p-type layer formed on the n⁻ layer;
   an n⁺ layer formed on the p-type layer;
   a gate trench formed from the n⁺ layer to the n⁻ layer, a bottom surface of the gate trench being the n⁻ layer;
   a body trench formed from the n⁺ layer to the p-type layer, a bottom surface of the body trench being the p-type layer;
   a source electrode contacted with the n⁺ layer;
   a body electrode formed in the body trench and contacted with p-type layer;
   a drain electrode formed on a rear surface of the substrate; wherein
   the gate insulating film and the $ZrO_UN_V$ surface layer are formed in the gate trench and a surface of the n⁺ layer; and wherein
   each of the n⁻ layer, the p-type layer and the n⁺ layer comprises a Group III nitride semiconductor.

13. The MIS-type transistor according to claim 1, wherein the MIS-type transistor is a lateral MISFET, the MIS-type transistor comprising:
   a substrate;
   a buffer layer formed on the substrate;
   a first carrier transport layer formed on the buffer layer;
   two separate second carrier transport layers of selective crystal re-growth formed in two regions separated on the first carrier transport layer, respectively;
   two separate carrier supply layers of selective crystal re-growth formed on the two separate second carrier transport layers, respectively;
   two heterojunctions formed between each of two separate second carrier transport layers and each of the two separate carrier supply layers;
   a source electrode formed on one of the two separate carrier supply layers;
   a drain electrode formed on the other carrier supply layer; wherein
   the gate insulating film and the $ZrO_UN_V$ surface layer are formed on a part of first carrier transport layer and surfaces of the two separate carrier supply layers, a total thickness of the gate insulating film and the $ZrO_UN_V$ surface layer is smaller than a thickness of each of the two separate second carrier transport layers; and wherein
   each of the buffer layer, the first carrier transport layer, the two separate second carrier transport layers and the two separate carrier supply layers comprises a Group III nitride semiconductor.

14. The MIS-type transistor according to claim 12, wherein the oxygen composition ratio u of the $ZrO_UN_V$ surface layer is continuously increased as it is closer to the gate electrode in a thickness direction.

15. The MIS-type transistor according to claim 13, wherein the nitrogen composition ratio v of the $ZrO_UN_V$ surface layer is continuously decreased as it is closer to the gate electrode in a thickness direction.

16. The MIS-type transistor according to claim 12, wherein other insulating film having a different composition from that of the gate insulating film is formed between the gate insulating film and the $n^+$ layer and between the gate insulating film and the $n^-$ layer.

* * * * *